(12) United States Patent
Fukuoka et al.

(10) Patent No.: US 9,773,654 B2
(45) Date of Patent: Sep. 26, 2017

(54) FE-CO-BASED ALLOY SPUTTERING TARGET MATERIAL, AND METHOD OF PRODUCING SAME

(71) Applicant: HITACHI METALS, LTD., Minato-ku, Tokyo (JP)

(72) Inventors: Jun Fukuoka, Shimane (JP); Kazuya Saito, Tokyo (JP); Kouichi Sakamaki, Shimane (JP); Tomoyuki Hata, Shimane (JP)

(73) Assignee: HITACHI METALS, LTD., Tokyo (JP)

( * ) Notice: Subject to any disclaimer, the term of this patent is extended or adjusted under 35 U.S.C. 154(b) by 0 days.

(21) Appl. No.: 15/008,433

(22) Filed: Jan. 27, 2016

(65) Prior Publication Data

US 2016/0141158 A1    May 19, 2016

Related U.S. Application Data

(63) Continuation of application No. 14/382,552, filed as application No. PCT/JP2013/065106 on May 30, 2013, now abandoned.

(30) Foreign Application Priority Data

Jun. 6, 2012    (JP) ................................. 2012-128657

(51) Int. Cl.
    *C23C 14/34*    (2006.01)
    *H01J 37/34*    (2006.01)
(Continued)

(52) U.S. Cl.
    CPC ............ *H01J 37/3429* (2013.01); *B22F 3/14* (2013.01); *C22C 1/0433* (2013.01); *C22C 19/07* (2013.01);
(Continued)

(58) Field of Classification Search
    CPC ........ H01J 37/3429; B22F 3/14; C23C 14/14; C23C 14/20; C23C 14/3414;
(Continued)

(56) References Cited

U.S. PATENT DOCUMENTS

2010/0320084 A1    12/2010    Sato

FOREIGN PATENT DOCUMENTS

JP    2008-127588 A    6/2008
JP    2009-167529 A    7/2009
(Continued)

OTHER PUBLICATIONS

Translation to Shimizu (JP 2012-169021) published Sep. 2012.*
(Continued)

*Primary Examiner* — John Brayton
(74) *Attorney, Agent, or Firm* — SOLARIS Intellectual Property Group, PLLC

(57) ABSTRACT

Provided is a Fe—Co-based alloy sputtering target material having a composition represented as an atomic ratio by the compositional formula: $(Fe_a\text{—}Co_{100-a})_{100-b-c-d}\text{—}Ta_b\text{—}Nb_c\text{—}M_d$, wherein $0<a\le 80$, $0\le b\le 10$, $0\le c\le 15$, $5\le b+c\le 15$, $2\le d\le 20$, $15\le b+c+d\le 25$, and M represents one or more elements selected from the group consisting of Mo, Cr and W, with the balance consisting of unavoidable impurities, wherein the sputtering target material has a bending fracture strain $\epsilon_{fB}$ at 300° C. of 0.4% or more.

8 Claims, 9 Drawing Sheets

(51) Int. Cl.
| | |
|---|---|
| *B22F 3/14* | (2006.01) |
| *C22C 19/07* | (2006.01) |
| *C22C 38/00* | (2006.01) |
| *G11B 5/851* | (2006.01) |
| *C23C 14/20* | (2006.01) |
| *C22C 38/10* | (2006.01) |
| *C22C 38/12* | (2006.01) |
| *C22C 38/26* | (2006.01) |
| *H01F 41/18* | (2006.01) |
| *C22C 1/04* | (2006.01) |
| *C22C 33/02* | (2006.01) |
| *C22C 30/00* | (2006.01) |
| *C23C 14/14* | (2006.01) |
| *B22F 9/08* | (2006.01) |

(52) U.S. Cl.
CPC .......... *C22C 30/00* (2013.01); *C22C 33/0285* (2013.01); *C22C 38/00* (2013.01); *C22C 38/10* (2013.01); *C22C 38/12* (2013.01); *C22C 38/26* (2013.01); *C23C 14/14* (2013.01); *C23C 14/20* (2013.01); *C23C 14/3414* (2013.01); *G11B 5/851* (2013.01); *H01F 41/183* (2013.01); *B22F 9/082* (2013.01); *C22C 2202/02* (2013.01); *H01J 2237/02* (2013.01)

(58) Field of Classification Search
CPC ..... H01F 41/183; C22C 1/0433; C22C 30/00; C22C 38/00; C22C 38/10; C22C 38/12; C22C 38/26
See application file for complete search history.

(56) References Cited

FOREIGN PATENT DOCUMENTS

| | | |
|---|---|---|
| JP | 2009-167529 A1 * | 7/2009 |
| JP | 2010-018884 A1 * | 8/2009 |
| JP | 2010-018884 A | 1/2010 |
| JP | 2012-169021 A1 * | 9/2012 |
| JP | 2012-169021 A | 9/2015 |
| TW | 200831686 A | 8/2008 |
| WO | 2009/104509 A | 8/2009 |
| WO | WO 2012/111568 A1 * | 8/2012 |

OTHER PUBLICATIONS

Translation to Yamagiya (JP 2009-167529) published Jul. 2009.*
Translation to Fukuoka (JP 2010-018884) published Aug. 2009.*
English language translation of the following: Office action dated Aug. 30, 2016 from the TIPO in a Taiwan patent application related to the instant patent application.
Non-Final Office Action issued in co-pending U.S. Appl. No. 14/382,552 on Jun. 25, 2015.
Final Office Action issued in co-pending U.S. Appl. No. 14/382,552 on Oct. 28, 2015.

* cited by examiner

20 μm

20 μm

100 μm

FE-CO-BASED ALLOY SPUTTERING TARGET MATERIAL, AND METHOD OF PRODUCING SAME

CROSS-REFERENCE TO RELATED APPLICATION

This application is a continuation application of application Ser. No. 14/382,552, filed Sep. 3, 2014, which is based upon and claims the benefit of priority from International Application No. PCT/JP2013/065106, filed May 30, 2013. Further, this application claims priority from Japanese Patent Application No. 2012-128657, filed Jun. 6, 2012. The entire contents of the above-referenced patent applications are incorporated herein by reference in their entirely.

TECHNICAL FIELD

The present invention relates to a Fe—Co-based alloy sputtering target material for forming a soft magnetic film in a magnetic recording medium, and a method of producing the same.

BACKGROUND ART

In recent years, a vertical magnetic recording system has been put to practical use as a means for enhancing the recording density of a magnetic recording medium. A vertical magnetic recording system allows a magnetic film of a magnetic recording medium to be formed in a state that the easy axis of magnetization faces a direction perpendicular to the medium plane, and this is a method adequate for a high recording density, in which even if recording is carried out at an increased recording density, the diamagnetic field within recording bits is small and the recording and playback characteristics undergo less deterioration. In regard the vertical magnetic recording system, there have been developed magnetic recording media each equipped with a magnetic recording film having increased recording sensitivity, and a soft magnetic film.

Regarding the soft magnetic film of such a magnetic recording medium, there is a demand that the soft magnetic film has excellent soft magnetic characteristics, and has an amorphous structure. As an example of the soft magnetic film, use has been made of an alloy film produced by adding elements that promote the formation of an amorphous structure to a Fe—Co alloy containing Fe, which has a high saturation magnetic flux density, as a main component.

Furthermore, such an alloy film is also required to have corrosion resistance. In regard to the formation of an alloy film, for example, a Fe—Co-based alloy sputtering target material for a soft magnetic film, obtained by incorporating one kind or two kinds of elements selected from Nb or Ta into a Fe—Co alloy at a proportion of from 10 atom % to 20 atom %, has been proposed (see, for example, Patent Document 1). Specifically, the Fe—Co-based alloy sputtering target material is produced by mixing pure metal powder raw materials each having a metal purity of 99.9% or higher so as to obtain the composition of the sputtering target material, and sintering the mixed powder thus obtained.

CITATION LIST

Patent Document

Patent Document 1: WO 2009/104509

SUMMARY OF INVENTION

Technical Problem

In the Fe—Co-based alloy sputtering target material disclosed in Patent Document 1 mentioned above, an amorphous structure having excellent soft magnetic characteristics can be formed by adding a single element of Ta or Nb, and a soft magnetic film having superior corrosion resistance can be formed. Therefore, the method of using a Fe—Co-based alloy sputtering target material is a useful technology in view of facilitating the control of components.

However, according to the studies of the inventors of the present invention, when a Fe—Co—Ta-based alloy sputtering target material produced by the production method disclosed in Patent Document 1 was subjected to sputtering at a high input power, and it was confirmed that there were occasions in which cracks were generated in the sputtering target material.

The invention has been made in view of such circumstances. Under the circumstances as described above, there is a demand for a Fe—Co-based alloy sputtering target material in which even if sputtering is performed at a high input power, generation of cracks in the sputtering target material is suppressed, and from which a soft magnetic film having an amorphous structure, excellent soft magnetic characteristics, high corrosion resistance and the like is obtained; and for a method of producing the same material.

Solution to Problem

The inventors found that the problems described above can be solved by optimizing the composition of the sputtering target material, and then adjusting the bending fracture strain at a high temperature to a certain level or higher, thus completing the invention.

Specific means for achieving the problems described above are as follows. That is:

According to a first aspect of the invention, there is provided a Fe—Co-based alloy sputtering target material having a composition represented as an atomic ratio by the compositional formula: $(Fe_a-Co_{100-a})_{100-b-c-d}-Ta_b-Nb_c-M_d$, wherein $0<a\leq80$, $0\leq b\leq10$, $0\leq c\leq15$, $5\leq b+c\leq15$, $2\leq d\leq20$, $15\leq b+c+d\leq25$, and M represents one or more elements selected from the group consisting of Mo, Cr and W, with the balance consisting of unavoidable impurities, wherein the sputtering target material has a bending fracture strain $\epsilon_{fB}$ at 300° C. of 0.4% or more.

According to the first aspect of the invention, it is preferable that b in the compositional formula satisfies the relationship: b=0.

Furthermore, according to the first aspect of the invention, it is preferable that an area ratio, in a field of vision of from 0.01 mm² to 0.10 mm², of an intermetallic compound phase containing one or more selected from Ta or Nb is 30 area % or less. When an inscribed circle is drawn in a region of an intermetallic compound phase containing one or more selected from Ta or Nb, the maximum diameter of the inscribed circle is preferably in the range of 30 μm or less.

According to a second aspect of the invention, there is provided a method of producing a Fe—Co-based alloy sputtering target material, the method including pressurized sintering, a powdered composition having a composition represented as an atomic ratio by the compositional formula: $(Fe_a-Co_{1000-a})_{100-b-c-d}-Ta_b-Nb_c-M_d$, wherein $0<a\leq80$, $0\leq b\leq10$, $0\leq c\leq15$, $5\leq b+c\leq15$, $2\leq d\leq20$, $15\leq b+c+d\leq25$, and M represents one or more elements selected from the group consisting of Mo, Cr and W, with the balance consisting of unavoidable impurities, under conditions of a sintering temperature of from 800° C. to 1400° C., a pressurizing pressure of from 100 MPa to 200 MPa, and a sintering time of from 1 hour to 10 hours.

That is, the Fe—Co-based alloy sputtering target material of the first aspect may be obtained by pressurized sintering a powdered composition represented by the compositional formula described above, under the conditions of a sintering temperature of from 800° C. to 1400° C., a pressurizing pressure of from 100 MPa to 200 MPa, and a sintering time of from 1 hour to 10 hours.

According to the second aspect of the invention, it is preferable that b in the compositional formula satisfies the relationship: b=0.

Advantageous Effects of Invention

According to the invention, there is provided a Fe—Co-based alloy sputtering target material which suppresses the generation of cracks in the sputtering target material even in the case of performing sputtering at a high input power, and forms a soft magnetic film having an amorphous structure, excellent soft magnetic characteristics, high corrosion resistance and the like.

According to the invention, there is also provided a method of producing a Fe—Co-based alloy sputtering target material which suppresses the generation of cracks in the sputtering target material even in the case of performing sputtering at a high input power, and stably forms a soft magnetic film of a magnetic recording medium.

DESCRIPTION OF EMBODIMENTS

Figure 1:
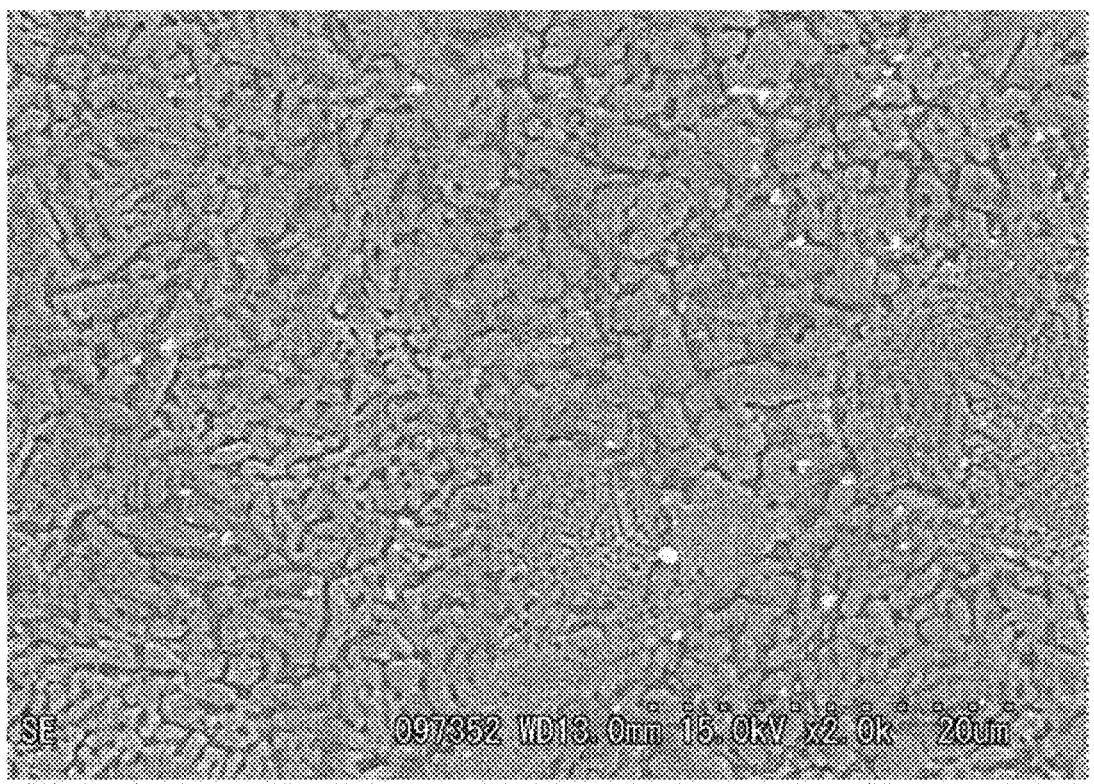
FIG. 1 is a scanning electron microscopic observation photograph of the sputtering target material of Inventive Example 1.

The present inventors paid attention to the metallographic structures and the mechanical characteristics at high temperatures of Fe—Co-based alloy sputtering target materials, and thus conducted various investigations. A sputtering target material is exposed to plasma discharge during sputtering and undergoes an increase in temperature, and therefore, the sputtering target material is subjected to indirect cooling through the back surface. However, when sputtering is carried at a high input power in order to increase the rate of film formation and to enhance the productivity for a magnetic recording medium, even if cooling is conducted through the back surface of the sputtering target material, the temperature of the sputtering target material rises and reaches 200° C. to 300° C. The present inventors confirmed that, for example, since the outer circumferential area of the sputtering target material is fixed by clamps, when the temperature of the sputtering target material rises, distortion caused by thermal expansion occurs, and cracks are generated.

A feature of the invention lies in that suppression of crack generation in a sputtering target material is realized by optimizing the composition of a Fe—Co-based alloy sputtering target material, and then adjusting the bending fracture strain at a particular temperature that is applied to the sputtering target material by heat generation at the time of sputtering, to a certain value or more. Hereinafter, this will be explained in detail.

In this invention, the bending fracture strain at 300° C. of the sputtering target material is adjusted to 0.4% or more, in order to suppress cracking of the sputtering target material at the time of sputtering. Here, the bending fracture strain as used in this invention is the bending strain obtainable when a material defined according to JIS K7171 is fractured. This bending fracture strain can be calculated by performing a three-point bending test on a specimen obtained from the sputtering target material, measuring the deflection amount of the specimen until fracture, and substituting the value for Formula (1). Here, $\varepsilon_{fB}$ represents the bending fracture strain; $s_B$ represents the deflection amount of the specimen until fracture; h represents the thickness of the specimen; and L represents the distance between support points. Furthermore, when the measurement is made in a high temperature environment at 300° C., the testing machine is furnished with a constant temperature chamber, and measurement is made in a state in which the specimen is heated and maintained at 300° C.

$$\varepsilon_{fB} = \frac{600\, s_B h}{L^2}(\%) \qquad \text{Formula (1)}$$

The bending fracture strain $\varepsilon_{fB}$ at 300° C. has been defined in the invention because, first, the temperature applied to the sputtering target material during sputtering reaches about 300° C. Then, the coefficient of thermal expansion at 300° C. of the Fe—Co-based alloy sputtering target material of the invention at this time may be adjusted to the range of from 0.25% to 0.35%. If the bending fracture strain $\varepsilon_{fB}$ at 300° C. is less than 0.4%, when sputtering is carried out at a high input power, the value of the coefficient of thermal expansion approaches close to the value of bending fracture strain, and as a result, cracks are generated in the sputtering target material.

In this invention, when the bending fracture strain $\varepsilon_{fB}$ at 300° C. is adjusted to 0.4% or more, a bending fracture strain $\varepsilon_{fB}$ which is sufficiently higher than the strain produced by thermal expansion can be realized, and crack generation in the sputtering target material at the time of sputtering may be suppressed.

The Fe—Co-based alloy sputtering target material of the invention is a Fe—Co-based alloy sputtering target material having a composition represented by the following compositional formula (wherein each of a, b, c and d represents the proportion of each atom species (atom %)), with the balance consisting of unavoidable impurities:

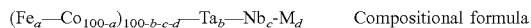

$(Fe_a\text{—}Co_{100-a})_{100-b-c-d}\text{—}Ta_b\text{—}Nb_c\text{-}M_d$    Compositional formula In the compositional formula, a, b, c, and d satisfy the relationships: $0<a\leq80$, $0\leq b\leq10$, $0\leq c\leq15$, $5\leq b+c\leq15$, $2\leq d\leq20$, and $15\leq b+c+d\leq25$; and the element represented by M is one or more elements selected from the group consisting of Mo, Cr, and W.

First, Ta and Nb have been selected as additive elements because since these elements show a deep eutectic type phase diagram with respect to Fe or Co, the elements have an effect of causing a Fe—Co-based alloy to acquire an amorphous structure at the time of sputtering.

Furthermore, Ta and Nb have been selected as additive elements because since it has been revealed that these elements form a dense passivation film over a wide range of pH in the potential-pH diagram, the elements have an effect of enhancing corrosion resistance of the soft magnetic film thus formed. A key feature of the invention is that the amount of addition of Ta (b in the compositional formula) is adjusted to be not more than 10 atom %, the amount of addition of Nb (c in the compositional formula) is adjusted to be not more than 15 atom %, and the total amount of addition of Ta and Nb (b+c in the compositional formula) is adjusted to be not more than 15 atom %. When the amounts of addition exceed these values, a brittle intermetallic compound phase containing one or more selected from Ta or Nb is formed in a large quantity, and therefore, it may be difficult to adjust the bending fracture strain $\epsilon_{fB}$ at 300° C. of the sputtering target material to 0.4% or more.

Furthermore, if the total amount of addition of Ta and Nb is less than 5 atom %, the soft magnetic film thus formed cannot be made to have an amorphous structure, and corrosion resistance is also decreased.

Among others, the total amount of addition of Ta and Nb (b+c in the compositional formula) is preferably in the range of from 5 atom % to 12 atom % due to the reasons described above.

According to the invention, it is more preferable that Ta is not incorporated (b=0 in the compositional formula). That is because a Ta compound is more brittle than a Nb compound, and a noticeable decrease in the bending fracture strain $\epsilon_{fB}$ at 300° C. occurs relative to the amount of addition.

Furthermore, the amount of addition of Nb (c in the compositional formula) is preferably in the range of from 5 atom % to 12 atom %, for the same reasons as described above.

The Fe—Co-based alloy sputtering target material of the invention contains, as the element M, one or more selected from the group of Mo, Cr and W in an amount of from 2 atom % to 20 atom %, and the sum of the element M, Ta and Nb (b+c+d in the compositional formula) is set to the range of from 15 atom % to 25 atom %. Only with the ranges of the amounts of addition of Ta and Nb, it is difficult to obtain a sufficiently stable amorphous structure and high corrosion resistance. Thus, when the element M is added in combination with Ta and Nb, the Fe—Co-based alloy sputtering target material of the invention can form a stable amorphous structure with a Fe—Co-based alloy, and corrosion resistance can be further enhanced.

Furthermore, in regard to the Fe—Co-based alloy sputtering target material of the invention, by adding the element M, a soft magnetic film having characteristics (amorphous structure, excellent soft magnetic characteristics, high corrosion resistance, and the like) that are equivalent to those obtainable in the case of adding Ta and Nb in large amounts, may be obtained, and also, a sputtering target material having a bending fracture strain $\epsilon_{fB}$ at 300° C. of 0.4% or more may be obtained. Among others, the element M is particularly preferably W.

If the amount of addition of the element M (d in the compositional formula) is less than 2 atom %, and the total amount of addition of the element M, Ta, and Nb (b+c+d in the compositional formula) is less than 15 atom %, a stable amorphous structure may not be obtained in the soft magnetic film thus obtained, and corrosion resistance is also decreased. When the amount of addition of the element M is more than 20 atom %, and the sum of the element M, Ta, and Nb is more than 25 atom %, the soft magnetic characteristics of the soft magnetic film thus formed are deteriorated.

The total amount of addition of the element M, Ta, and Nb (b+c+d in the compositional formula) is preferably in the range of from 15 atom % to 22 atom %, for the same reasons as described above.

The Fe—Co alloy that serves as a base of the sputtering target material of the invention has a composition in which the compositional formula ($Fe_a$—$Co_{100-a}$) as an atomic ratio is represented by the expression: $0<a\leq80$. This is because when a Fe—Co alloy having a composition in this range is used as a base, a soft magnetic film having excellent soft magnetic characteristics may be obtained. If the atomic ratio of Fe is more than 80%, the soft magnetic characteristics deteriorated; therefore, the atomic ratio of Fe with respect to Co is set to the range of more than 0 and 80% or less. In this regard, the same also applies to the compositional formula of the Fe—Co-based alloy sputtering target material of the invention. Among others, a preferred range of a is such that $55\leq a\leq70$.

In regard to the Fe—Co-based alloy sputtering target material of the invention, the balance other than Ta, Nb and the element M that are incorporated in the proportion ranges described above, is composed of Fe, Co, and unavoidable impurities. A content of impurities that is as small as possible is preferred. The contents of oxygen and nitrogen, which are gaseous components, are preferably 1000 ppm by mass or less, and the total content of impurity elements such as Ni other than the gaseous components that are inevitably contained is preferably 1000 ppm by mass or less.

The Fe—Co-based alloy sputtering target material of the invention may contain one or more selected from B, Si, or Al at a proportion of from 0 atom % to 10 atom %. This is because a stable amorphous structure may be obtained in a soft magnetic film formed by adding B, Si or Al, and these elements also have an auxiliary role of increasing the hardness. If the amount of addition of B, Si or Al is more than 10 atom %, the soft magnetic characteristics are deteriorated.

In regard to the Fe—Co-based alloy sputtering target material of the invention, it is preferable to adjust the relative density to 99% or more. That is because if the relative density is lowered to below 99% due to defects such as voids in the sputtering target material, local stress concentration occurs at the defect areas, and thereby, the bending fracture strain Cm may be decreased, or cracks may be generated.

Meanwhile, the relative density as used herein means a value obtained by dividing the density measured by the Archimedes's method, by the theoretical density obtained as a weighted average of simple elements that have been calculated using the mass ratio obtainable from the compositional ratio of the Fe—Co-based alloy sputtering target material of the invention, and multiplying the resultant by 100.

The Fe—Co-based alloy sputtering target material of the invention is preferably such that the maximum diameter of the inscribed circle that can be drawn in the intermetallic compound phase containing one or more selected from Ta or Nb is 30 μm or less. Examples of the intermetallic compound phase containing one or more selected from Ta or Nb include $Fe_2Ta$, $FeTa$, $Fe_2Nb$, $FeNb$, $Co_7Ta$, $Co_2Ta$, $Co_6Ta_7$, $CoTa_2$, $Co_3Nb$, $Co_2Nb$, and $Co_7Nb_6$. These intermetallic compound phases are brittle, and if coarse intermetallic compound grains are present in the structure, it may become difficult to adjust the bending fracture strain $\epsilon_{fB}$ at 300° C. to 0.4% or more.

In this invention, when an inscribed circle is drawn in a region of an intermetallic compound containing one or more selected from Ta or Nb, the maximum diameter of the inscribed circle is more preferably 10 μm or less, and even more preferably 5 μm or less. The maximum diameter of the inscribed circle is practically 0.5 μm or more.

The presence of the intermetallic compound phase containing one or more selected from Ta or Nb can be confirmed by, for example, an X-ray diffraction method, energy dispersive X-ray spectroscopy, or the like Furthermore, in regard to the Fe—Co-based alloy sputtering target material of the invention, it is preferable that the area ratio of the intermetallic compound phase containing one or more selected from Ta or Nb is also decreased. Specifically, in a field of vision ranging from 0.01 $mm^2$ to 0.10 $mm^2$, it is preferable to adjust the area ratio of the intermetallic compound phase to 60 area % or less, more preferably to 40 area % or less, and even more preferably to 20 area % or less. The area ratio of the intermetallic compound phase is practically 5 area % or more.

In regard to the Fe—Co-based alloy sputtering target material of the invention, it is preferable to reduce the residual stress. In the production process for a sputtering target material, at the time of pressurized sintering or mechanical working after pressurized sintering, or when a blast treatment is applied to the outer circumferential area, residual stress may accumulate in the sputtering target material. There is a risk that when this residual stress increases, the bending fracture strain $\epsilon_{fB}$ may decrease. In this invention, it is preferable to perform a post-treatment such as a heat treatment, in order to relieve the residual stress of the Fe—Co-based alloy sputtering target material.

The Fe—Co-based alloy sputtering target material of the invention may be obtained by pressurized sintering a powdered composition having a composition represented as an atomic ratio by the compositional formula: $(Fe_a-Co_{100-a})_{100-b-c-d}-Ta_b-Nb_c-M_d$, wherein 0<a≤80, 0≤b≤10, 0≤c≤15, 5≤b+c≤15, 2≤d≤20, 15≤b+c+d≤25, and M represents one or more elements selected from the group consisting of Mo, Cr and W, with the balance consisting of unavoidable impurities, under conditions of a sintering temperature of from 800° C. to 1400° C., a pressurizing pressure of from 100 MPa to 200 MPa, and a sintering time of from 1 hour to 10 hours.

A preferred embodiment of a, b, c, d and M in the compositional formula of the Fe—Co-based alloy sputtering target material is as described above.

In general, the method of producing a sputtering target material may be roughly classified into a melting method and a pressurized sintering method. In the melting method, in order to promote reduction of casting defects present in a casting ingot that serves as a base material of the target material, or to promote homogenization of the structure, it is necessary to subject the casting ingot to plastic working such as hot rolling. In regard to the Fe—Co-based alloy containing Ta or Nb of the invention, a coarse intermetallic compound phase containing one or more selected from Ta or Nb is likely to be formed during the cooling course at the time of casting. For that reason, there is a tendency that hot workability is very poor, and it may be difficult to produce a sputtering target material stably. Therefore, in this invention, a Fe—Co-based alloy sputtering target material is obtained by pressurized sintering a powdered composition under specific conditions.

Regarding the method of pressurized sintering, hot isostatic press, hot press, discharge plasma sintering, extrusion press sintering, and the like may be used. Among them, hot isostatic press is suitable because the conditions for pressurized sintering that will be described below can be stably realized.

According to the invention, the sintering temperature is set to 800° C. to 1400° C. If the sintering temperature is lower than 800° C., sintering of a powder containing one or more selected from Ta or Nb, which are high melting point metals, does not proceed sufficiently, and voids are formed. On the other hand, if the sintering temperature is higher than 1400° C., the Fe—Co alloy powder may melt. In order to increase the C by minimizing the formation of pores, and then suppressing the growth of the intermetallic compound phase containing one or more selected from Ta or Nb, it is more preferable to sinter the alloy at a temperature of from 900° C. to 1300° C.

Furthermore, according to the invention, the pressurizing pressure is adjusted to 100 MPa to 200 MPa. If the pressurizing pressure is less than 100 MPa, sufficient sintering cannot be achieved, and voids are likely to be formed in the structure of the sputtering target material. On the other hand, if the pressurizing pressure is more than 200 MPa, residual stress is introduced into the sputtering target material at the time of sintering. In order to increase the $\epsilon_{fB}$ while minimizing the formation of voids, and suppressing the introduction of residual stress, it is more preferable to perform sintering at a pressurizing pressure of from 120 MPa to 160 MPa.

Furthermore, according to the invention, the sintering time is adjusted to 1 hour to 10 hours. If the sintering time is less than 1 hour, sintering does not proceed sufficiently, and it is difficult to suppress the formation of voids. On the other hand, if the sintering time exceeds 10 hours, the production efficiency is markedly deteriorated, and thus it is desirable to avoid this. In order to increase the $\epsilon_{fB}$ while minimizing the formation of voids, and suppressing the growth of the intermetallic compound phase containing one or more selected from Ta or Nb, it is more preferable to perform sintering for a sintering time of from 1 hour to 3 hours.

Regarding the powdered composition as used herein, a mixed powder obtained by mixing plural alloy powders or pure metal powders to the final composition, or a powder that has been adjusted to the final composition may be applied. In a method of performing pressurized sintering by using a mixed powder obtained by mixing plural alloy powders or pure metal powders to the final composition as the powdered composition, the magnetic permeability of the sputtering target material can be decreased by adjusting the kind of the powders mixed. Therefore, there is obtained an effect that strong leakage flux is obtained from a back cathode, and the use efficiency can be increased.

Furthermore, in a method of performing pressurized sintering by using a powder that has been adjusted to the final composition as the powdered composition, there is obtained an effect that the intermetallic compound phase containing one or more selected from Ta or Nb can be finely and uniformly dispersed in a stable manner. According to the invention, in order to increase the $\epsilon_{fB}$ at 300° C., it is preferable to perform pressurized sintering by using a powdered composition of alloy powders at the final composition.

According to the invention, it is more preferable not to incorporate Ta into the powder composition. That is because the formation of an intermetallic compound phase containing Ta, which is more brittle than an intermetallic compound phase containing Nb, can be suppressed.

Also, the powder composition used for the pressurized sintering may be produced by a method of producing a powder composition by pulverizing an ingot obtained by casting a molten alloy which has the components adjusted to a desired composition, or by a gas atomization method of forming a powder by spraying a molten alloy by means of an inert gas. Among them, the gas atomization method in which incorporation of impurities occurs to a less extent, and a spherical powder appropriate for sintering is obtained with a high packing ratio, is preferred. In order to suppress oxidation of the spherical powder, it is preferable to use Ar gas or nitrogen gas, which are both inert gases, as the atomizing gas.

EXAMPLES

Hereinafter, the invention will be described more specifically by way of Examples, but the invention is not intended to be limited to the following Examples as long as the gist is maintained. Unless particularly stated otherwise, the unit "parts" is on a mass basis.

Example 1

As Inventive Example 1, a powdered composition was produced by preparing a gas atomized powder that is to have an alloy composition of Fe-17Co-16Nb (atom %) with a purity of 99.9% or higher, a gas atomized powder that is to have an alloy composition of Co-5Nb (atom %) with a purity of 99.9% or higher, and a Fe powder and a Mo powder, both having a purity of 99.9% or higher, and weighing and mixing the powders so as to obtain an alloy composition of $(Fe_{65}-Co_{35})_{82}-Nb_9-Mo_9$ (atom %).

The powdered composition described above was filled into a pressurized container made of mild steel, followed by degassing and sealing, and then a sintered body was produced by a hot isostatic press method under the conditions of a temperature of 950° C., a pressure of 150 MPa, and a retention time of 1 hour. This sintered body was subjected to mechanical working, and thus a sputtering target material as Inventive Example 1 having a diameter of 180 mm and a thickness of 7 mm was obtained.

As Inventive Example 2, a powdered composition was produced by preparing a gas atomized powder that is to have an alloy composition of Fe-17Co-16Nb (atom %) with a purity of 99.9% or higher, a gas atomized powder that is to have an alloy composition of Co-5Nb (atom %) with a purity of 99.9% or higher, and a Fe powder and a Mo powder, both having a purity of 99.9% or higher, and weighing and mixing the powders so as to obtain an alloy composition of $(Fe_{65}-Co_{35})_{80}-Nb_{10}-Mo_{10}$ (atom %).

The powdered composition described above was filled into a pressurized container made of mild steel, followed by degassing and sealing, and then a sintered body was produced by a hot isostatic press method under the conditions of a temperature of 950° C., a pressure of 150 MPa, and a retention time of 1 hour. This sintered body was subjected to mechanical working, and thus a sputtering target material as Inventive Example 2 having a diameter of 180 mm and a thickness of 7 mm was obtained.

As Conventional Example 1, a powdered composition was produced by preparing a Co gas atomized powder having a purity of 99.9% or higher, and a Fe powder and a Ta powder, both having a purity of 99.9% or higher, and weighing and mixing the powders so as to obtain an alloy composition of $(Fe_{65}-Co_{35})_{82}-Ta_{18}$ (atom %).

The powdered composition described above was filled into a pressurized container made of mild steel, followed by degassing and sealing, and then a sintered body was produced by a hot isostatic press method under the conditions of a temperature of 1250° C., a pressure of 120 MPa, and a retention time of 2 hours. This sintered body was subjected to mechanical working, and thus a sputtering target material as Conventional Example 1 having a diameter of 180 mm and a thickness of 7 mm was obtained.

Two specimens each having a size of 10 mm×10 mm×5 mm were taken from edge materials of the various sputtering target materials produced as described above. For one of these specimens, contaminants such as black scales were removed from the entire surface, and the density was measured by the Archimedes's method. The measurement was carried out using an electronic gravimeter SD-120L manufactured by Kensei Co., Ltd. As explained above, the relatively density was calculated from the density thus obtained and the theoretical density. The relative density thus calculated is presented in Table 1.

As presented in Table 1, it was confirmed that Inventive Example 1, Inventive Example 2, and Conventional Example 1 were high-density sputtering target materials having a relative density of more than 100%.

Furthermore, the other specimen between the specimens taken as described above was subjected to buff polishing against a surface having a size of 10 mm×10 mm, and then to flat milling using Ar gas. The microstructure of the surface that had been subjected to flat milling of the specimen was observed using a scanning electron microscope S-3500N manufactured by Hitachi, Ltd. Furthermore, for the specimen that had been subjected to flat milling, the presence of an intermetallic compound phase containing one or more selected from Ta or Nb was confirmed by energy dispersive X-ray spectroscopy. The metallographic structure of Inventive Example 1 is presented in FIG. 1, the metallographic structure of Inventive Example 2 is presented in FIG. 3, and the metallographic structure of Conventional Example 1 is presented in FIG. 4.

Figure 2:
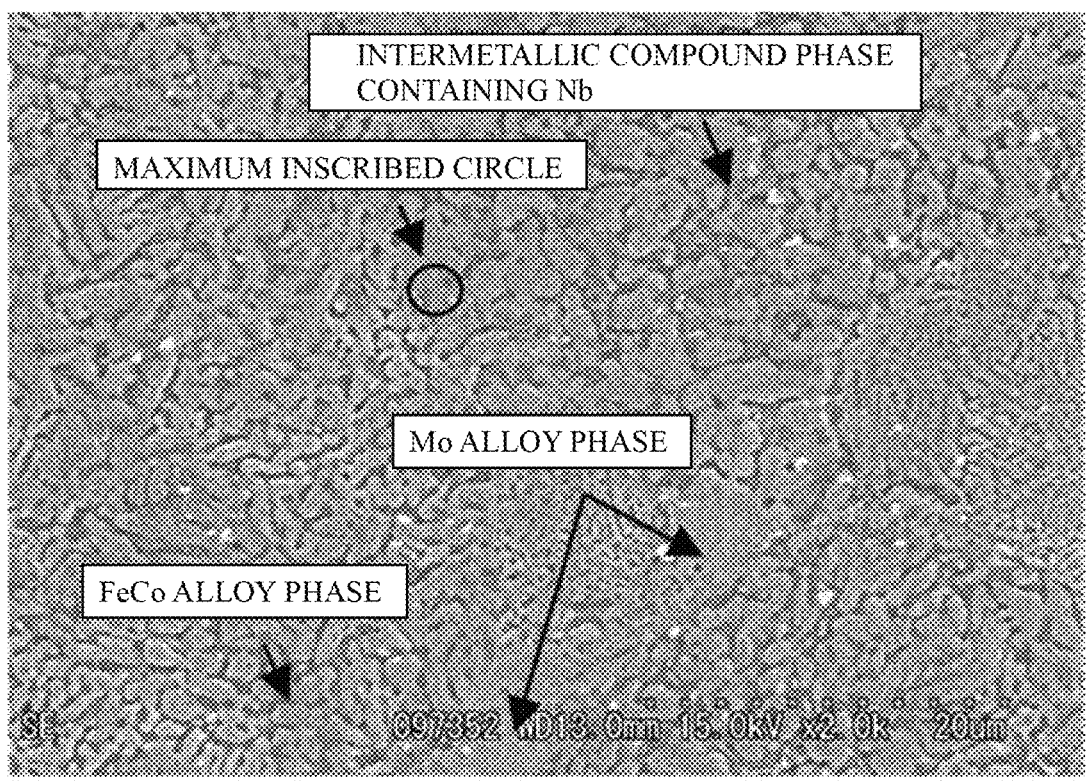
FIG. 2 is a schematic diagram of the metal structure of the sputtering target material of Inventive Example 1.

As illustrated in the measurement example of FIG. 2, images of the specimens were captured at a magnification ratio at which the intermetallic compound phase containing one or more selected from Ta or Nb could be clearly observed, and from this metallographic structure, the maximum diameter of the inscribed circle that could be drawn on the intermetallic compound phase containing one or more selected from Ta or Nb was measured. The results are presented in Table 1.

Figure 3:
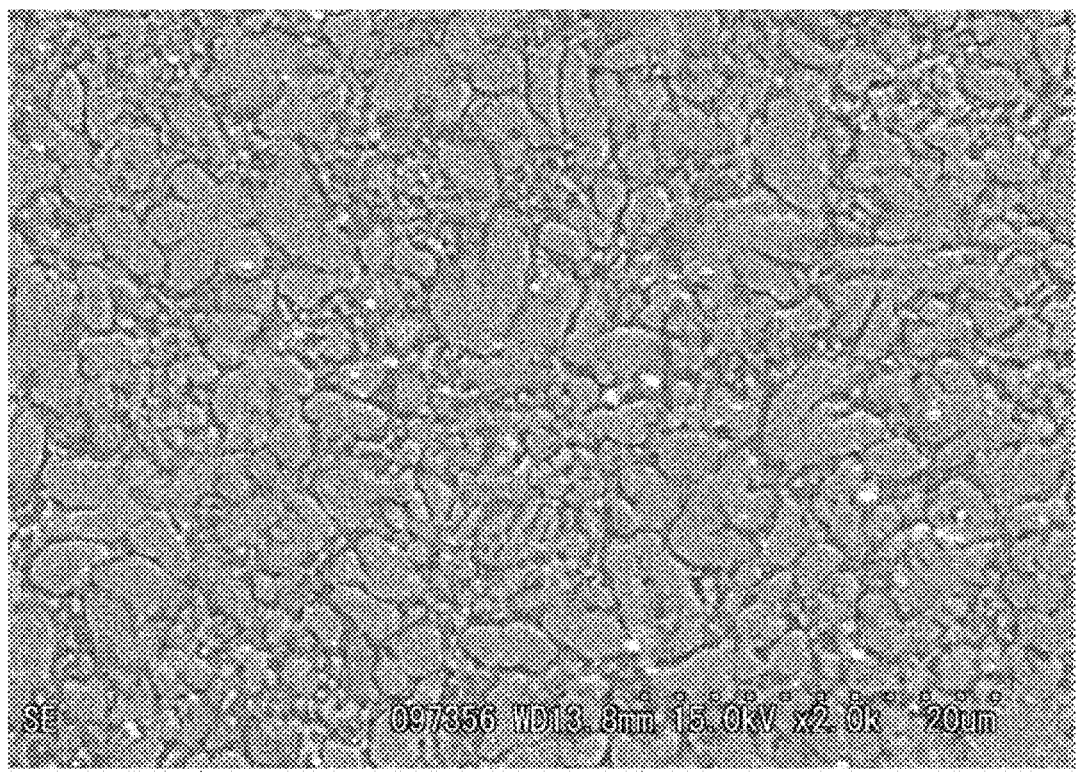
FIG. 3 is a scanning electron microscopic observation photograph of the sputtering target material of Inventive Example 2.
Figure 4:
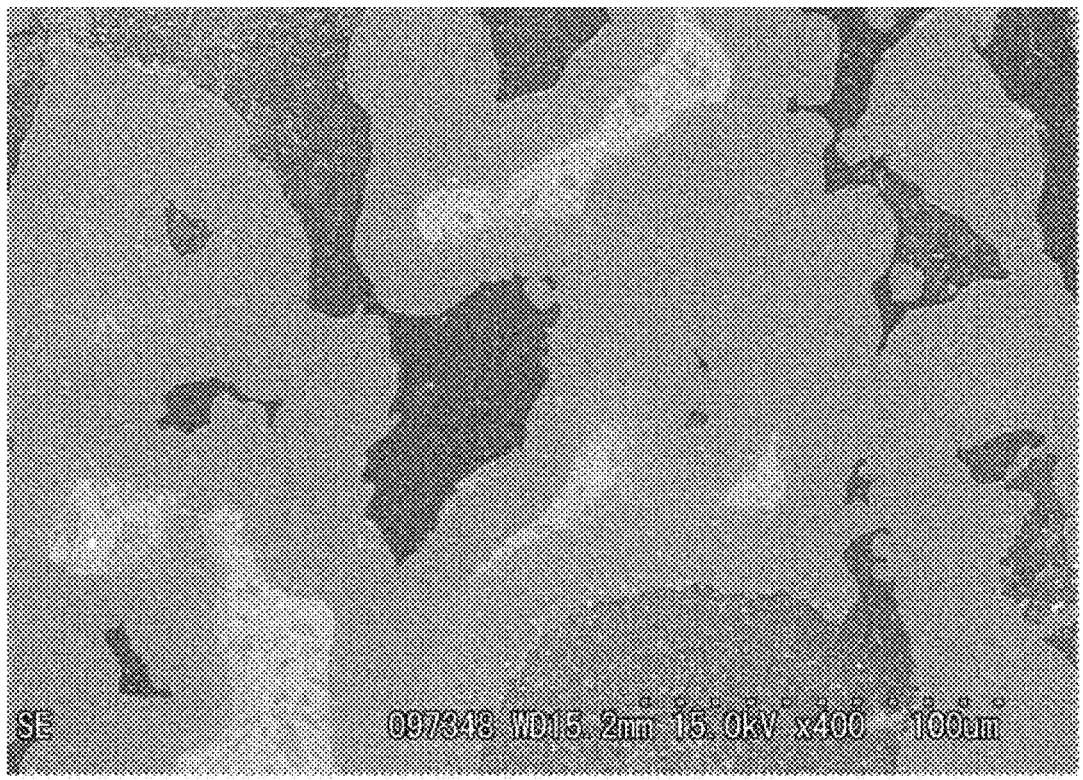
FIG. 4 is a scanning electron microscopic observation photograph of the sputtering target material of Conventional Example 1.

As illustrated in FIG. 1, FIG. 3, FIG. 4, and Table 1, it was confirmed that in the Fe—Co-based alloy sputtering target materials of Inventive Example 1 and Inventive Example 2, the maximum diameter of the inscribed circle that could be drawn on the intermetallic compound phase containing Nb was 30 μm or less, and the intermetallic compound phase containing Nb had a fine structure. On the other hand, in regard to the Fe—Co-based alloy sputtering target material of Conventional Example 1, it was confirmed that the maximum diameter of the inscribed circle that could be drawn on the intermetallic compound phase containing Ta was more than 30 μm, and the intermetallic compound phase containing Ta had a coarse structure.

Next, four specimens each having a size of 5 mm×5 mm×70 mm were taken from the simple material of each of the sputtering target materials produced as described above. For the specimens thus taken, a three-point bending test was carried out using a hydraulic servo high temperature fatigue testing machine EFH50-5 manufactured by Saginomiya Seisakusho, Inc., at a cross-head speed of 0.5 mm/min and a distance between support points of 50 mm at various temperatures (room temperature 20° C., 200° C., 300° C., 400° C., and 500° C.). The deflection amount of the specimen until fracture was measured from a bending load-deflection curve obtained by the foregoing test, and the bending fracture strains $\epsilon_{fB}$ at various temperatures were calculated from Formula (1) described above.

Figure 5:
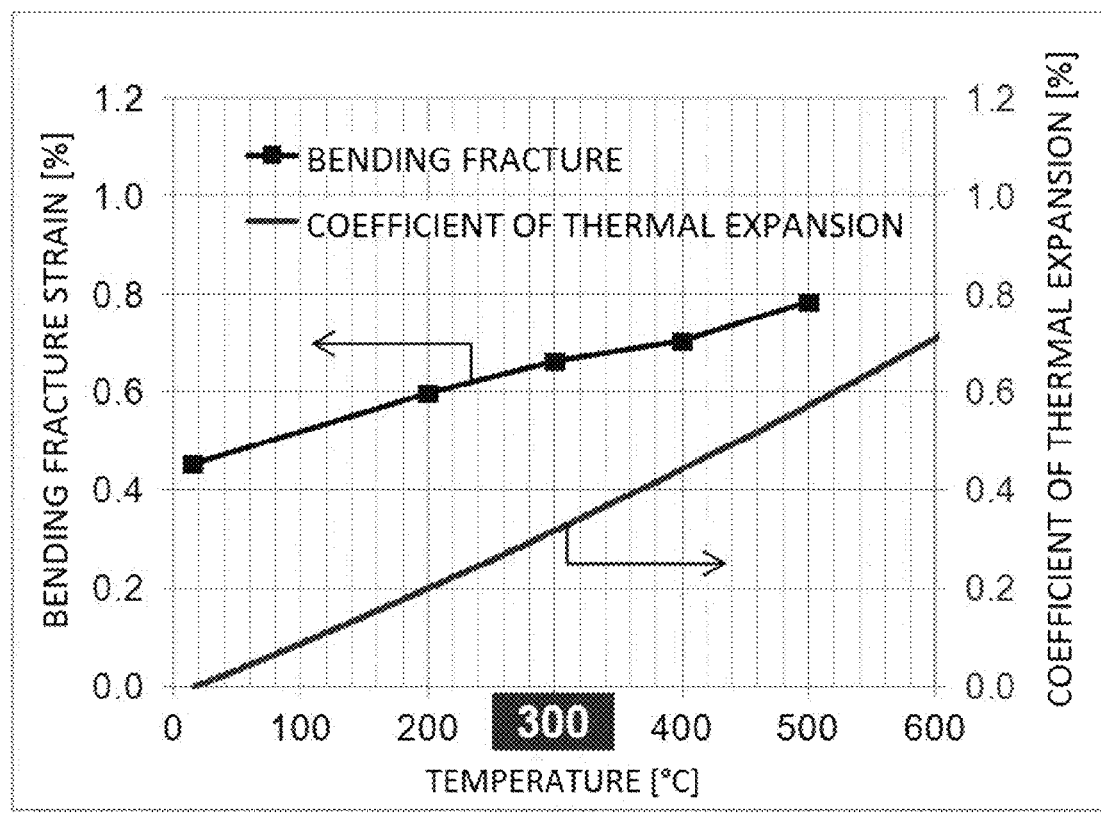
FIG. 5 is a diagram showing the relationship between the bending fracture strain and the coefficient of thermal expansion at various temperatures of Inventive Example 1.
Figure 6:
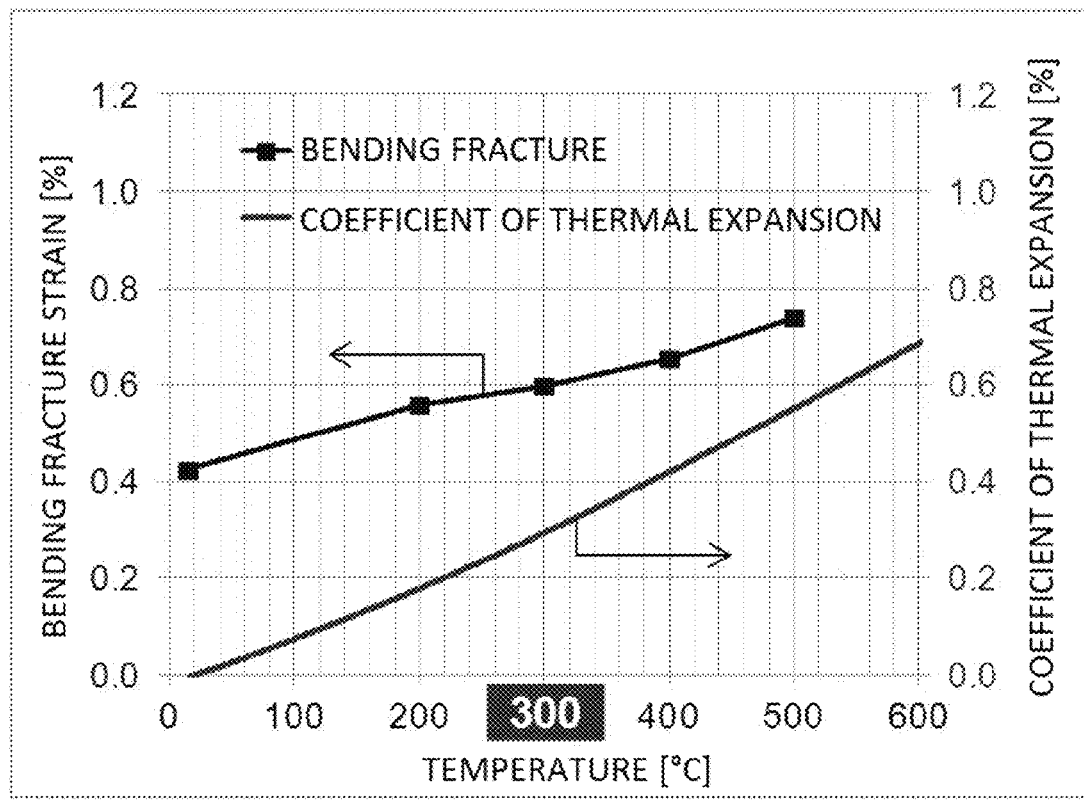
FIG. 6 is a diagram showing the relationship between the bending fracture strain and the coefficient of thermal expansion at various temperatures of Inventive Example 2.
Figure 7:
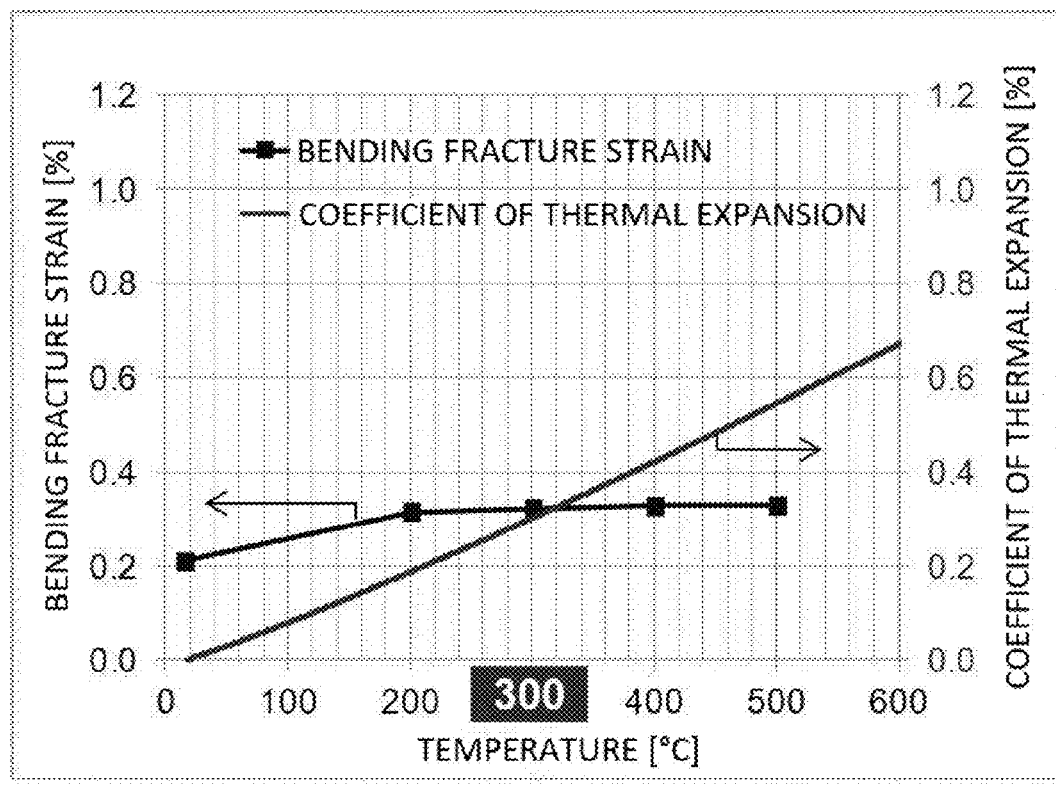
FIG. 7 is a diagram showing the relationship between the bending fracture strain and the coefficient of thermal expansion at various temperatures of Conventional Example 1.

The bending fracture strains $\epsilon_{fB}$ at various temperatures of Inventive Example 1, Inventive Example 2, and Conventional Example 1 are presented in FIG. 5 to FIG. 7, and the bending fracture strains $\epsilon_{fB}$ at 300° C. are presented in Table 1.

Furthermore, one specimen having a diameter of 5 mm and a height of 19.5 mm (having an opening for thermocouple insertion having a diameter of 2 mm×height of 8 mm) was taken from the simple material of each of the sputtering target materials produced as described above. For each of the specimens thus taken, the coefficient of thermal expansion from room temperature to 1000° C. was measured using a thermomechanical analyzer TMA8310C manufactured by Rigaku Corp., and using $SiO_2$ as a standard sample. The coefficients of thermal expansion at various temperatures of Inventive Example 1, Inventive Example 2, and Conventional Example 1 are presented in FIG. 5 and FIG. 6, and the coefficients of thermal expansion at 300° C. are presented in Table 1.

As can be seen from FIG. 5 to FIG. 7 and Table 1, in regard to the Fe—Co-based alloy sputtering target materials of Inventive Example 1 and Inventive Example 2, the bending fracture strains $\epsilon_{fB}$ at 300° C. exhibited values of more than 0.4%, and it was confirmed that the bending fracture strains had values larger than the values of the coefficients of thermal expansion at 300° C. On the other hand, in regard to the Fe—Co-based alloy sputtering target material of Conventional Example 1, the bending fracture strain $\epsilon_{fB}$ at 300° C. was less than 0.4%, and it was confirmed that the bending fracture strain had a value approximately equal to the value of the coefficient of thermal expansion at 300° C.

Next, the surface having a size of 10 mm×10 mm of the specimen used for density measurement was subjected to buff polishing, and then finish polishing was performed using colloidal silica (OP—S) manufactured by Marumoto Struers K.K. In regard to an arbitrary region having an area of 0.06 mm², a phase analysis was carried out by elemental mapping and energy dispersive X-ray spectroscopy, using a field emission type scanning electron microscopic apparatus ULTRA55 manufactured by Carl Zeiss Group, and the area ratio of the intermetallic compound phase containing one or more selected from Ta or Nb was measured. The area ratios of the intermetallic compound phases containing one or more selected from Ta or Nb thus measured are presented in Table 2.

As can be seen from Table 2, in regard to the Fe—Co-based alloy sputtering target materials of Inventive Example 1 and Inventive Example 2, the area ratio of the intermetallic compound phase containing Nb was 40 area % or less, and it was confirmed that the area ratio of the intermetallic compound phase containing Nb had been decreased.

On the other hand, in regard to the Fe—Co-based alloy sputtering target material of Conventional Example 1, the area ratio of the intermetallic compound phase containing Ta was more than 40 area %, and it was confirmed that the area ratio of the intermetallic compound phase containing Ta was high.

TABLE 2

| | Composition of sputtering target material (atom %) | Area ratio of metalized compound containing one or more selected from Ta or Nb (%) |
|---|---|---|
| Inventive Example 1 | $(Fe_{65}\text{-}Co_{35})_{82}\text{-}Nb_9\text{-}Mo_9$ | 19 |
| Inventive Example 2 | $(Fe_{65}\text{-}Co_{35})_{80}\text{-}Nb_{10}\text{-}Mo_{10}$ | 20 |
| Conventional Example 1 | $(Fe_{65}\text{-}Co_{35})_{82}\text{-}Ta_{18}$ | 44 |

Next, each of the sputtering target materials of Inventive Example 1, Inventive Example 2, and Conventional Example produced as described above was disposed in the chamber of a DC magnetron sputtering apparatus (C3010:

TABLE 1

| | Composition of sputtering target material (atom %) | Relative density (%) | Diameter of maximum inscribed circle (μm) | $\epsilon_{fB}$ at 300° C. (%) | Coefficient of thermal expansion at 300° C. (%) |
|---|---|---|---|---|---|
| Inventive Example 1 | $(Fe_{65}\text{-}Co_{35})_{82}\text{-}Nb_9\text{-}Mo_9$ | 100.1 | 2.9 | 0.66 | 0.32 |
| Inventive Example 2 | $(Fe_{65}\text{-}Co_{35})_{80}\text{-}Nb_{10}\text{-}Mo_{10}$ | 100.1 | 4.2 | 0.60 | 0.29 |
| Conventional Example 1 | $(Fe_{65}\text{-}Co_{35})_{82}\text{-}Ta_{18}$ | 100.1 | 65.5 | 0.32 | 0.30 | manufactured by Canon Anelva Corp.,). Air in the chamber was exhausted until the ultimate degree of vacuum reached $2\times10^{-5}$ Pa or less, and then sputtering was carried out continuous for 120 seconds or longer under the conditions of an Ar gas pressure of 0.6 Pa and an input power of 1500 W. These conditions were assumed to be harsh conditions of performing sputtering continuously for a long time at a high input power.

After the sputtering, the vacuum inside the chamber was relieved to atmospheric pressure, and the various sputtering target materials were checked. As a result, it was confirmed that the sputtering target materials of Inventive Example 1 and Inventive Example 2 did not have generation of cracks, and it was confirmed that even if sputtering is carried out at a high input power, it is possible to suppress the generation of cracks.

On the other hand, in regard to the sputtering target material of Conventional Example 1, it was confirmed that cracks had been generated.

Example 2

Next, the three kinds of Fe—Co-based alloy sputtering target materials produced as described above, and a C (carbon) sputtering target material were disposed inside each of Chamber 1 and Chamber 2 of a DC magnetron sputtering apparatus (C3010: manufactured by Canon Anelva Corp.), and air in the respective chambers was exhausted until the ultimate degree of vacuum reached $2\times10^{-5}$ Pa or less. At this time, the Fe—Co-based alloy sputtering target materials of Inventive Example 1, Inventive Example 2, and Conventional Example were disposed sequentially in the chamber. Then, a soft magnetic film having a thickness of 40 nm was formed by sputtering on each of a glass substrate having a size of 70 mm×25 mm and a glass substrate having a diameter of 10 mm. Furthermore, a soft magnetic film having a thickness of 200 nm was formed by sputtering on a glass substrate having a size of 50 mm×25 mm, and then a C (carbon) film having a thickness of 5 nm was formed by sputtering as a protective film.

The sputtering conditions for the soft magnetic film were set to an Ar gas pressure of 0.6 Pa, and an input power of 1000 W. Furthermore, the sputtering conditions for C (carbon) were set to an Ar gas pressure of 0.60 Pa, and an input power of 1500 W.

For the various samples in each of which a soft magnetic film was formed on a glass substrate having a size of 70 mm×25 mm as described above, an X-ray diffraction analysis was carried out using an X-ray diffraction apparatus RINT2500V manufactured by Rigaku Corp., and using Co as a radiation source. The X-ray diffraction profiles thus obtained are illustrated in FIG. 8.

Figure 8:
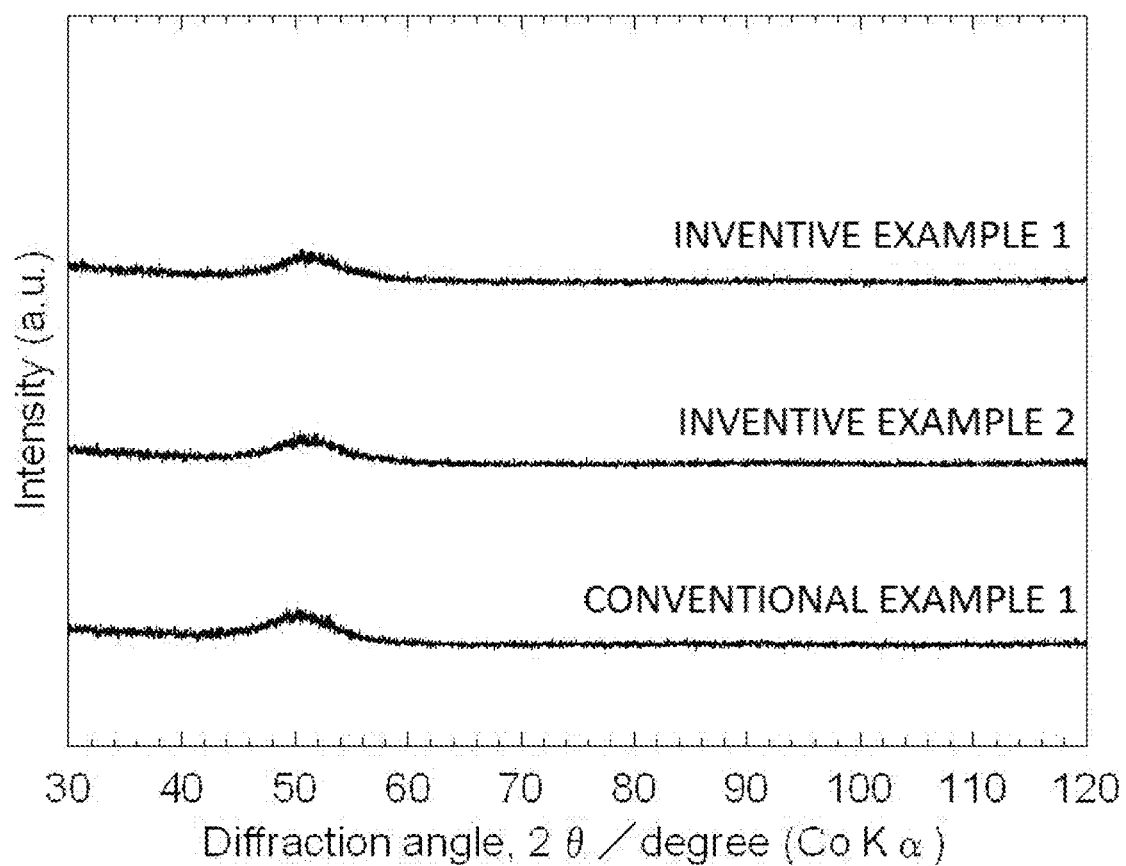
FIG. 8 shows X-ray diffraction profiles of soft magnetic films formed using the sputtering target materials of Inventive Example 1, Inventive Example 2, and Conventional Example 1.

In regard to the soft magnetic films formed using the sputtering target materials of Inventive Example 1, Inventive Example 2, and Conventional Example, since diffraction peaks attributable to the crystal structure were not observed from FIG. 8, it was confirmed that the soft magnetic films had an amorphous structure.

Next, for each of the samples in which a soft magnetic film was formed on a glass substrate having a diameter of 10 mm as described above, a B—H curve was measured by applying a maximum magnetic field of 80 kA/m in the in-plane easy axis of magnetization using a vibrating sample type magnetometer VSM-5 manufactured by Riken Denshi co., Ltd., and thus the coercive force was determined. The results are presented in Table 3.

For each of the samples in which a soft magnetic film was formed on a glass substrate having a size of 70 mm×25 mm as described above, the sample was immersed for 3 hours at room temperature in a 10% nitric acid solution that had been diluted with pure water to 10%, and then the amount of Co eluted into the 10% nitric acid solution (amount of Co elution) was analyzed by an inductively coupled plasma emission spectroscopic analysis. The results are presented in Table 3.

TABLE 3

| | Composition of sputtering target material (atom %) | Soft magnetic characteristics Coercive force (A/m) | Corrosion resistance Amount of Co elution (mg/L) |
|---|---|---|---|
| Inventive Example 1 | $(Fe_{65}\text{-}Co_{35})_{82}\text{-}Nb_9\text{-}Mo_9$ | 716 | <0.01 |
| Inventive Example 2 | $(Fe_{65}\text{-}Co_{35})_{80}\text{-}Nb_{10}\text{-}Mo_{10}$ | 836 | <0.01 |
| Conventional Example 1 | $(Fe_{65}\text{-}Co_{35})_{82}\text{-}Ta_{18}$ | 876 | <0.01 |

From FIG. 8 and Table 3, it could be confirmed that a soft magnetic film formed using the Fe—Co-based alloy sputtering target material of the invention has a low coercive force, excellent soft magnetic characteristics, and high corrosion resistance, and has characteristics equivalent to those of a soft magnetic film formed using the Fe—Co-based alloy sputtering target material of Conventional Example 1.

Example 3

As Inventive Example 3 to Inventive Example 10 and Comparative Example 1, each powdered composition was produced by weighing and mixing raw material powders so as to obtain the composition of each of the sputtering target materials indicated in Table 4. The powdered composition thus produced was filled into a pressurized container made of mild steel, followed by degassing and sealing, and then a sintered body was produced by a hot isostatic press method under the conditions indicated in Table 3. The sintered body thus produced was subjected to mechanical working, and thus the sputtering target materials as Inventive Example 3 to Inventive Example 10 and Comparative Example 1, each having a diameter of 180 mm and a thickness of 7 mm, were obtained.

TABLE 4

| | Composition of sputtering target material (atom %) | Raw material powder (atom %) | Sintering temperature (° C.) | Pressurizing pressure (MPa) | Sintering time (Hr) |
|---|---|---|---|---|---|
| Inventive Example 3 | $(Fe_{65}\text{-}Co_{35})_{82}\text{-}Nb_9\text{-}Cr_9$ | Fe-27Co-22Nb atomized powder, pure Fe, pure Co, pure Cr | 950 | 120 | 1 |

TABLE 4-continued

| | Composition of sputtering target material (atom %) | Raw material powder (atom %) | Sintering temperature (° C.) | Pressurizing pressure (MPa) | Sintering time (Hr) |
|---|---|---|---|---|---|
| Inventive Example 4 | $(Fe_{65}\text{-}Co_{35})_{82}\text{-}Nb_9\text{-}W_9$ | Fe-17Co-16Nb atomized powder, pure Fe, pure Co, pure W | 950 | 120 | 1 |
| Inventive Example 5 | $(Fe_{65}\text{-}Co_{35})_{81}\text{-}Nb_{10}\text{-}Mo_9$ | Fe-28Co-10Nb-9Mo atomized powder | 950 | 150 | 1 |
| Inventive Example 6 | $(Fe_{30}\text{-}Co_{70})_{84}\text{-}Nb_9\text{-}Mo_7$ | Fe-27Co-15Nb-13Mo atomized powder, Co-20Nb atomized powder, pure Co, pure Mo | 950 | 120 | 1 |
| Inventive Example 7 | $(Fe_{30}\text{-}Co_{70})_{83}\text{-}Nb_9\text{-}Mo_8$ | Fe-27Co-15Nb-13Mo atomized powder, Co-20Nb atomized powder, pure Co, pure Mo | 950 | 120 | 1 |
| Inventive Example 8 | $(Fe_{30}\text{-}Co_{70})_{82}\text{-}Nb_9\text{-}Mo_9$ | Fe-27Co-15Nb-13Mo atomized powder, Co-20Nb atomized powder, pure Co, pure Mo | 950 | 120 | 1 |
| Inventive Example 9 | $(Fe_{10}\text{-}Co_{90})_{80}\text{-}Nb_{10}\text{-}Mo_{10}$ | Fe-27Co-15Nb-13Mo atomized powder, Co-20Nb atomized powder, pure Co, pure Mo | 950 | 120 | 1 |
| Inventive Example 10 | $(Fe_{65}\text{-}Co_{35})_{85}\text{-}Ta_6\text{-}Mo_9$ | Fe-8Ta atomized powder, Co-8Ta atomized powder, pure Fe, pure Mo | 950 | 120 | 1 |
| Comparative Example 1 | $(Fe_{65}\text{-}Co_{35})_{87}\text{-}Nb_4\text{-}Mo_9$ | Fe-27Co-15Nb-13Mo atomized powder, pure Fe, pure Co, pure Mo | 950 | 120 | 1 |

For the various sputtering target materials produced as described above, the relative density, the maximum diameter of the inscribed circle that could be drawn on the intermetallic compound phase containing one or more selected from Ta or Nb, the bending fracture strain $\epsilon_{fB}$ at 300° C., and the coefficient of thermal expansion at 300° C. were measured in the same manner as in Example 1, and the results are presented in Table 5.

Furthermore, in regard to the Fe—Co-based alloy sputtering target material of Inventive Example 4, it was confirmed that the relative density was about 98%, but the maximum diameter of the inscribed circle drawn on the intermetallic compound phase containing Nb was 30 μm or less, and the bending fracture strain $\epsilon_{fB}$ at 300° C. had a value of more than 0.4% so that the value was larger than the value of the coefficient of thermal expansion at 300° C.

TABLE 5

| | Composition of sputtering target material (atom %) | Relative density (%) | Diameter of maximum inscribed circle (um) | $\epsilon_{fB}$ at 300° C. | Coefficient of thermal expansion at 300° C. |
|---|---|---|---|---|---|
| Inventive Example 3 | $(Fe_{65}\text{-}Co_{35})_{82}\text{-}Nb_9\text{-}Cr_9$ | 100.2 | 4.4 | 0.99 | 0.34 |
| Inventive Example 4 | $(Fe_{65}\text{-}Co_{35})_{82}\text{-}Nb_9\text{-}W_9$ | 97.9 | 3.2 | 0.76 | 0.30 |
| Inventive Example 5 | $(Fe_{65}\text{-}Co_{35})_{81}\text{-}Nb_{10}\text{-}Mo_9$ | 101.3 | 3.2 | 0.80 | 0.31 |
| Inventive Example 6 | $(Fe_{30}\text{-}Co_{70})_{84}\text{-}Nb_9\text{-}Mo_7$ | 99.4 | 7.7 | 0.67 | 0.34 |
| Inventive Example 7 | $(Fe_{30}\text{-}Co_{70})_{83}\text{-}Nb_9\text{-}Mo_8$ | 99.0 | 8.6 | 0.63 | 0.33 |
| Inventive Example 8 | $(Fe_{30}\text{-}Co_{70})_{82}\text{-}Nb_9\text{-}Mo_9$ | 99.0 | 8.6 | 0.60 | 0.33 |
| Inventive Example 9 | $(Fe_{10}\text{-}Co_{90})_{80}\text{-}Nb_{10}\text{-}Mo_{10}$ | 99.0 | 7.3 | 0.67 | 0.33 |
| Inventive Example 10 | $(Fe_{65}\text{-}Co_{35})_{85}\text{-}Ta_6\text{-}Mo_9$ | 99.8 | 3.7 | 0.97 | 0.33 |
| Comparative Example 1 | $(Fe_{65}\text{-}Co_{35})_{87}\text{-}Nb_4\text{-}Mo_9$ | 100.0 | 3.2 | 0.70 | 0.32 |

As can be seen from Table 5, it was confirmed that the Fe—Co-based alloy sputtering target materials of Inventive Example 3, Inventive Example 5 to Inventive Example 9, and Comparative Example 1 had relative densities of 99% or higher. Furthermore, in regard to these sputtering target materials, it was confirmed that the maximum diameter of the inscribed circle drawn on the intermetallic compound phase containing Nb was 30 μm or less, and the bending fracture strain $\epsilon_{fB}$ at 300° C. had a value of more than 0.4% so that the value was larger than the value of the coefficient of thermal expansion at 300° C.

In regard to the Fe—Co-based alloy sputtering target material of Inventive Example 10, it was confirmed that the relative density was 99% or more, the maximum diameter of the inscribed circle drawn on the intermetallic compound phase containing Ta was 30 μm or less, and the bending fracture strain $\epsilon_{fB}$ at 300° C. had a value of more than 0.4% so that the value was larger than the value of the coefficient of thermal expansion at 300° C.

Next, for the sputtering target materials of Inventive Example 3, Inventive Example 4, Inventive Example 6 to Inventive Example 10 and Comparative Example 1 produced as described above, the area ratios of the intermetallic compound phases containing one or more selected from Ta or Nb were measured in the same manner as in Example 1. The results are presented in Table 6.

As can be seen from Table 6, in regard to the Fe—Co-based alloy sputtering target materials of Inventive Example 3, Inventive Example 4, and Inventive Example 6 to Inventive Example 10, the area ratios of the intermetallic compound phases containing Nb were 40 area % or less, and it was confirmed that the area ratios of the intermetallic compound phases containing Nb had been decreased.

On the other hand, in regard to the Fe—Co-based alloy sputtering target material of Comparative Example 1 having a composition that did not fit in the component ranges defined in the invention, it was confirmed that the area ratio of the intermetallic compound phase containing Nb was less than 15 area %. This is speculated to be because the amount of addition of Nb was as low as less than 5 atom %.

TABLE 6

| | Composition of sputtering target material (atom %) | Area ratio of metalized compound containing one or more selected from Ta or Nb (%) |
|---|---|---|
| Inventive Example 3 | $(Fe_{65}\text{-}Co_{35})_{82}\text{-}Nb_9\text{-}Cr_9$ | 28 |
| Inventive Example 4 | $(Fe_{65}\text{-}Co_{35})_{82}\text{-}Nb_9\text{-}W_9$ | 19 |
| Inventive Example 6 | $(Fe_{30}\text{-}Co_{70})_{84}\text{-}Nb_9\text{-}Mo_7$ | 22 |
| Inventive Example 7 | $(Fe_{30}\text{-}Co_{70})_{83}\text{-}Nb_9\text{-}Mo_8$ | 23 |
| Inventive Example 8 | $(Fe_{30}\text{-}Co_{70})_{82}\text{-}Nb_9\text{-}Mo_9$ | 22 |
| Inventive Example 9 | $(Fe_{10}\text{-}Co_{90})_{80}\text{-}Nb_{10}\text{-}Mo_{10}$ | 24 |
| Inventive Example 10 | $(Fe_{65}\text{-}Co_{35})_{85}\text{-}Ta_6\text{-}Mo_9$ | 23 |
| Comparative Example 1 | $(Fe_{65}\text{-}Co_{35})_{87}\text{-}Nb_4\text{-}Mo_9$ | 13 |

Next, the Fe—Co-based alloy sputtering target materials of Inventive Example 3 to Inventive Example 10 and Comparative Example 1 produced as described above were respectively disposed sequentially in the chamber of a DC magnetron sputtering apparatus (C3010: manufactured by Canon Anelva Corp.,). Air in the chamber in which the various target materials were disposed was exhausted until the ultimate degree of vacuum reached $2 \times 10^{-5}$ Pa or less, and then sputtering was carried out continuously for 120 seconds or longer under the conditions of an Ar gas pressure of 0.6 Pa and an input power of 1500 W. These conditions were assumed to be harsh conditions of performing sputtering continuously for a long time at a high input power.

After the sputtering, the vacuum inside the chamber was relieved to atmospheric pressure, and the various sputtering target materials were checked. As a result, it was confirmed that the sputtering target materials of Inventive Example 3 to Inventive Example 10 did not have generation of cracks, and it was confirmed that even if sputtering is carried out at a high input power, it is possible to suppress the generation of cracks.

On the other hand, in regard to the sputtering target material of Comparative Example 1, it was confirmed that cracks had been generated.

Example 4

Next, the seven kinds of Fe—Co-based alloy sputtering target materials produced as described above, and a C (carbon) sputtering target material were disposed inside each of Chamber 1 and Chamber 2 of a DC magnetron sputtering apparatus (C3010: manufactured by Canon Anelva Corp.), and air in the respective chambers was exhausted until the ultimate degree of vacuum reached $2 \times 10^{-5}$ Pa or less. At this time, the Fe—Co-based alloy sputtering target materials of Inventive Example 3 to Inventive Example 8 and Conventional Example were disposed sequentially in the chamber. Then, a soft magnetic film having a thickness of 40 nm was formed by sputtering on a glass substrate having a size of 70 mm×25 mm. Furthermore, a soft magnetic film having a thickness of 200 nm was formed by sputtering on a glass substrate having a size of 50 mm×25 mm, and then a C (carbon) film having a thickness of 5 nm was formed by sputtering as a protective film.

The sputtering conditions for the soft magnetic film were set to an Ar gas pressure of 0.6 Pa and an input power of 1000 W. Furthermore, the sputtering conditions for C (carbon) were set to an Ar gas pressure of 0.60 Pa and an input power of 1500 W.

For each of the samples in which a soft magnetic film was formed on a glass substrate having a size of 70 mm×25 mm as described above, an X-ray diffraction analysis was carried out in the same manner as in Example 2. The X-ray diffraction profiles of Inventive Example 3, Inventive Example 8, and Comparative Example 1 as representative examples are presented in FIG. 9.

Figure 9:
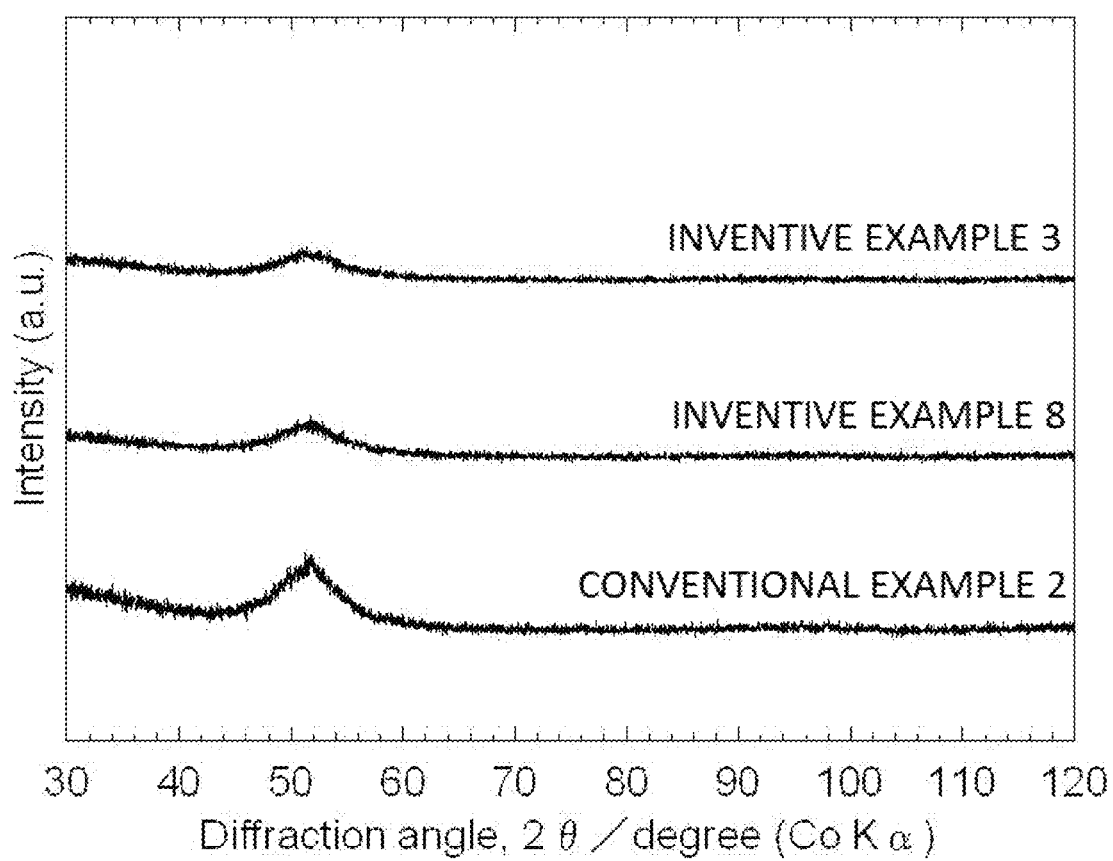
FIG. 9 shows X-ray diffraction profiles of soft magnetic films formed using the sputtering target materials of Inventive Example 3, Inventive Example 8, and Comparative Example 1.

In regard to the soft magnetic films formed using the sputtering target materials of the invention, since diffraction peaks attributable to the crystal structure were not observed from FIG. 9, it was confirmed that the soft magnetic films had an amorphous structure.

On the other hand, in regard to the soft magnetic film formed using Comparative Example 1 having a composition that did not fit in the component ranges defined in the invention, although the intensity near $2\theta=52°$ was weak, since sharp diffraction peaks were observed, it was confirmed that the soft magnetic film had a structure in which a crystalline structure and an amorphous structure were present in mixture, and a stable amorphous structure was not obtained.

Next, for each of the samples in which a soft magnetic film was formed on a glass substrate having a size of 70 mm×25 mm as described above, the sample was immersed for 3 hours at room temperature in a 10% nitric acid solution that had been diluted with pure water to 10%, and then the amount of Co eluted into the 10% nitric acid solution (amount of Co elution) was analyzed by an inductively coupled plasma emission spectroscopic analysis. The results are presented in Table 7.

TABLE 7

| | Composition of sputtering target material (atom %) | Corrosion resistance Amount of Co elution (mg/L) |
|---|---|---|
| Inventive Example 3 | $(Fe_{65}\text{-}Co_{35})_{82}\text{-}Nb_9\text{-}Cr_9$ | <0.01 |
| Inventive Example 4 | $(Fe_{65}\text{-}Co_{35})_{82}\text{-}Nb_9\text{-}W_9$ | <0.01 |
| Inventive Example 5 | $(Fe_{65}\text{-}Co_{35})_{81}\text{-}Nb_{10}\text{-}Mo_9$ | <0.01 |
| Inventive Example 6 | $(Fe_{30}\text{-}Co_{70})_{84}\text{-}Nb_9\text{-}Mo_7$ | <0.01 |
| Inventive Example 7 | $(Fe_{30}\text{-}Co_{70})_{83}\text{-}Nb_9\text{-}Mo_8$ | <0.01 |

TABLE 7-continued

|  | Composition of sputtering target material (atom %) | Corrosion resistance Amount of Co elution (mg/L) |
|---|---|---|
| Inventive Example 8 | $(Fe_{30}\text{-}Co_{70})_{82}\text{-}Nb_9\text{-}Mo_9$ | <0.01 |
| Comparative Example 1 | $(Fe_{65}\text{-}Co_{35})_{87}\text{-}Nb_4\text{-}Mo_9$ | 0.04 |

From FIG. 9 and Table 7, the soft magnetic films formed using the Fe—Co-based alloy sputtering target materials of the invention have high corrosion resistance, and it could be confirmed that the soft magnetic films have characteristics equivalent to those of the soft magnetic film formed using the Fe—Co-based alloy sputtering target material of Conventional Example 1.

On the other hand, in regard to the soft magnetic film formed using the Fe—Co-based alloy sputtering target material of Comparative Example 1 having a composition that did not fit in the component ranges defined in the invention, it was confirmed that since the amount of addition of Nb was as small as less than 5 atom %, a stable amorphous structure was not obtained, and corrosion resistance was also low.

The entirety of the disclosure of Japanese Patent Application No. 2012-128657 was incorporated herein by reference.

All publications, patent applications, and technical standards mentioned in this specification are herein incorporated by reference to the same extent as if each individual publication, patent application, or technical standard was specifically and individually indicated to be incorporated by reference.

What is claimed is:

1. A Fe—Co-based alloy sputtering target material having a composition represented as an atomic ratio by the compositional formula:

$(Fe_a\text{—}Co_{100-a})_{100-b-c-d}\text{—}Ta_b\text{—}Nb_c\text{-}M_d$, wherein $0<a\leq80$, $0\leq b\leq10$, $0\leq c\leq15$, $5\leq b+c\leq15$, $7\leq d\leq20$, $15\leq b+c+d\leq25$, and M represents one or more elements selected from the group consisting of Mo, Cr and W, with the balance consisting of unavoidable impurities, wherein the sputtering target material has a bending fracture strain $\epsilon_{fB}$ at 300° C. of 0.4% or more, and wherein an area ratio, in an area of from 0.01 mm² to 0.10 mm², of an intermetallic compound phase containing one or more selected from Ta or Nb is 30 area % or less with respect to the Fe—Co-based alloy sputtering target material.

2. The Fe—Co-based alloy sputtering target material according to claim 1, wherein b in the compositional formula satisfies the relationship: b=0.

3. The Fe—Co-based alloy sputtering target material according to claim 1, wherein when an inscribed circle is drawn in a region of an intermetallic compound phase containing one or more selected from Ta or Nb, the maximum diameter of the inscribed circle is 30 μm or less.

4. The Fe—Co-based alloy sputtering target material according to claim 3, wherein the maximum diameter of the inscribed circle is 0.5 μm or more.

5. A method of producing a Fe—Co-based alloy sputtering target material, the method comprising pressurized sintering, a powdered composition having a composition represented as an atomic ratio by the compositional formula:

$(Fe_a\text{—}Co_{100-a})_{100-b-c-d}\text{—}Ta_b\text{—}Nb_c\text{-}M_d$, wherein $0<a\leq80$, $0\leq b\leq10$, $0\leq c\leq15$, $5\leq b+c\leq15$, $7\leq d\leq20$, $15\leq b+c+d\leq25$ and M represents one or more elements selected from the group consisting of Mo, Cr and W, with the balance consisting of unavoidable impurities, under conditions of a sintering temperature of from 800° C. to 1400° C., a pressurizing pressure of from 100 MPa to 200 MPa, and a sintering time of from 1 hour to 10 hours, and wherein an area ratio, in an area of from 0.01 mm² to 0.10 mm², of an intermetallic compound phase containing one or more selected from Ta or Nb is 30 area % or less with respect to the Fe-Co-based alloy sputtering target material.

6. The Fe—Co-based alloy sputtering target material according to claim 5, wherein b in the compositional formula satisfies the relationship: b=0.

7. The method of producing a Fe—Co-based alloy sputtering target material according to claim 5, wherein when an inscribed circle is drawn in a region of an intermetallic compound phase containing one or more selected from Ta or Nb, the maximum diameter of the inscribed circle is 30 μm or less.

8. The method of producing a Fe—Co-based alloy sputtering target material according to claim 7, wherein the maximum diameter of the inscribed circle is 0.5 μm or more.

* * * * *